United States Patent
Bloch et al.

(10) Patent No.: US 6,605,927 B2
(45) Date of Patent: Aug. 12, 2003

(54) CIRCUIT CONFIGURATION FOR DISCHARGING A CAPACITOR WHICH HAS BEEN CHARGED TO A HIGH VOLTAGE TO A LOW VOLTAGE UNDER THE CONTROL OF A CONTROL UNIT

(75) Inventors: Martin Bloch, Gröbenzell (DE); Esther Vega Ordonez, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/222,019

(22) Filed: Aug. 15, 2002

(65) Prior Publication Data

US 2003/0052541 A1 Mar. 20, 2003

Related U.S. Application Data

(63) Continuation of application No. PCT/DE01/00569, filed on Feb. 14, 2001.

(30) Foreign Application Priority Data

Feb. 15, 2000 (DE) .......................................... 100 06 517

(51) Int. Cl.$^7$ ................................................. H02J 7/10
(52) U.S. Cl. ........................................................ 320/166
(58) Field of Search ................................ 320/166, 167; 327/389, 546

(56) References Cited

U.S. PATENT DOCUMENTS 5,350,951 A    9/1994   Adachi

FOREIGN PATENT DOCUMENTS

| DE | 26 16 641 A1 | 11/1976 |
|----|--------------|---------|
| DE | 198 16 446 A1 | 10/1999 |
| JP | 62 124 700 | 6/1987 |

OTHER PUBLICATIONS

Shibata, K. et al.: "Energy Transmission of Switched–Capacitor Circuit and Application to dc–dc Converter", Electronics and Communications in Japan, vol. 74, No. 4, Scripta Technica, 1991, pp. 91–101.

*Primary Examiner*—Edward H. Tso
(74) *Attorney, Agent, or Firm*—Laurence A. Greenberg; Werner H. Stemer; Ralph E. Locher

(57) ABSTRACT

The object is to discharge a first capacitor from a high voltage to a low voltage. To this end, the one electrode of the first capacitor is linked with the one electrode of a second capacitor via a FET path. The other two electrodes of the two capacitors are connected to reference potential. A voltage source with its internal resistance is connected in parallel to the second capacitor. A discharge path leads from the one electrode of the first capacitor from the paths of two FET and a protective resistor to the reference potential. A current path leads from the one electrode of the second capacitor to the reference potential via the paths of two additional FET. A control unit switches on the discharge path. Once the voltage of the first capacity has decreased to the required lower value, the discharge path is blocked while a holding path is opened.

4 Claims, 3 Drawing Sheets

US 6,605,927 B2

CIRCUIT CONFIGURATION FOR DISCHARGING A CAPACITOR WHICH HAS BEEN CHARGED TO A HIGH VOLTAGE TO A LOW VOLTAGE UNDER THE CONTROL OF A CONTROL UNIT

CROSS-REFERENCE TO RELATED APPLICATION

This application is a continuation of copending International Application No. PCT/DE01/00569, filed Feb. 14, 2001, which designated the United States and which was not published in English.

BACKGROUND OF THE INVENTION

Field of the Invention

The invention relates to a circuit configuration for discharging a first capacitor which has been charged to a high voltage to a low voltage under the control of a control unit. One electrode of the first capacitor is thereby connected to reference-ground potential while the other electrode thereof is connected via the path electrodes of a first transistor to one electrode of a second capacitor whose other electrode is connected to reference-ground potential. A voltage source with its internal resistance is arranged in parallel with the second capacitor. Modern semiconductor circuits require a supply voltage which is both higher and lower than the supply voltage normally available. Semiconductor circuits containing memories such as flash, EEPROM, DRAM or FRAM require high voltages, whereas at the same time technologies in the order of magnitude of 0.25 $\mu$m to 0.18 $\mu$m require low supply voltages of, by way of example, 2.5 V, 1.8 V down to 1 V. Such low supply voltages are also necessary in order to keep the power consumption, particularly of contactless systems, such as mobile telephones, chip cards, smart cards, or devices in medical engineering, as low as possible.

FIG. 2 shows a prior art circuit configuration for discharging a first capacitor which has been charged to a high voltage to a low voltage under the control of a control unit, which is used in semiconductor circuits.

In the circuit of FIG. 2, one electrode of a first capacitor CH is connected to reference-ground potential while the other electrode thereof is connected to the source electrode of a PMOS field effect transistor P1. The drain electrode of the PMOS field effect transistor P1 is connected via a capacitor CL to reference-ground potential. Connected in parallel with the capacitor CL is a voltage source UL with its internal resistance RL. The source electrode of the PMOS transistor P1 is connected to reference-ground potential via a series circuit comprising the source-drain path of a PMOS transistor T1 and that of a field effect transistor T2. Connected in parallel with the series circuit comprising the source-drain paths of the two transistors T1 and T2 is a series circuit comprising the source-drain path of a PMOS transistor T3 and that of a field effect transistor T4. The gate electrode of the PMOS transistor T1 is connected to the common node for the two transistors T3 and T4 and to the gate electrode of the PMOS transistor T1. The gate electrode of the PMOS field effect transistor T3 is connected to the common node for the two transistors T1 and T2. The gate electrode of the transistor T4 is connected to the gate electrode of the transistor T2 via an inverter IN. The output of a control unit SE is connected to the gate electrode of the transistor T4 and hence to the input of the inverter IN.

The transistors T1 to T4 and the inverter IN represent a level converter.

The operation of the circuit configuration depicted in FIG. 2 is as follows:

The capacitor CH has been charged to the high voltage VH. The output of the control unit SE outputs a logic zero to the level converter, which turns off the PMOS field effect transistor P1. If the control unit SE outputs a logic 1 to the level converter, the PMOS transistor P1 turns on, so that the two capacitors CH and CL are connected in parallel. A discharge current I1 then flows from the capacitor CH through the PMOS field effect transistor P1 to the capacitor CL. This discharging operation proceeds according to a $1/e^t$ function, which means that, theoretically, the voltage across the capacitor CH falls to the voltage VL across the capacitor CL as $t \to \infty$. For this reason, the discharging operation takes a relatively long time. On account of the fact that the voltage source UL is not an ideal voltage source but rather a real voltage source, the voltage across the capacitor CL will be above the voltage VL by a small value and will not fall to the voltage value of the voltage source UL until toward the end of the discharging operation. On account of the fact that the potential on the gate electrode of the PMOS transistor P1 is quickly discharged to ground, this transistor P1 is subject to a high level of wear which considerably reduces its useful life and its reliability.

In order for the capacitor CH to be discharged to the voltage VL as accurately as possible, the capacitor CL needs to be chosen to be as large as possible, while the internal resistance RL of the voltage source UL needs to be chosen to be as small as possible. This requires precise knowledge of the characteristic curves for the capacitor CH and for the conduction resistance of the PMOS transistor P1. The greater the internal resistance RL of the voltage source UL, the larger the capacitor CL needing to be chosen to compensate. Following the discharging operation, the voltage VL across the capacitor CL can still be high enough for downstream circuit configurations with CMOS field effect transistors to be destroyed. This is the case, for example, when a supply voltage of 16 V is required for an EEPROM and a supply voltage of 1.5 V is required for a CMOS circuit configuration.

SUMMARY OF THE INVENTION

It is accordingly an object of the invention to provide a circuit configuration for discharging a first capacitor from a high voltage to a low voltage under the control of a control unit which overcomes the above-mentioned disadvantages of the heretofore-known devices and methods of this general type and which attains a rapid discharge to precisely the low voltage that is required.

With the foregoing and other objects in view there is provided, in accordance with the invention, a circuit configuration, comprising:

a first capacitor having a first electrode connected to reference-ground potential and a second electrode;

a second capacitor having a first electrode connected to reference-ground potential and a second electrode;

a first field effect transistor having a source electrode and a drain electrode connected between the second electrode of the first capacitor and the second electrode of the second capacitor;

a voltage source having an internal resistance connected in parallel with the second capacitor;

a second field effect transistor and a third field effect transistor connected to form a series circuit;

a first common node between the source electrode of the first field effect transistor and the first capacitor connected to reference-ground potential via the series circuit formed of the second field effect transistor and the third field effect transistor;

a fourth field effect transistor and a fifth field effect transistor connected to form a series circuit;

a second common node between the drain electrode of the first field effect transistor, the second capacitor, and the voltage source connected to reference-ground potential via the series circuit formed of the fourth field effect transistor and the fifth field effect transistor;

the first, fourth and fifth field effect transistors each having a gate electrode connected to a common node between the second and third field effect transistors);

a sixth field effect transistor having a gate electrode and having a path connected between reference-ground potential and a common node between the fourth and fifth field effect transistors, and the second field effect transistor having a gate electrode connected to the common node between the fourth and fifth field effect transistors;

an inverter having an input and having an output connected to the gate electrode of the sixth field effect transistor; and a control unit having a control output connected to a gate electrode of the third field effect transistor and to the input of the inverter.

In accordance with an added feature of the invention, a protective resistor is connected between the third field effect transistor and reference-ground potential.

In accordance with an additional feature of the invention, the first, second and fourth field effect transistors are PMOS field effect transistors.

In accordance with a concomitant feature of the invention, the third, fifth and sixth field effect transistors are CMOS field effect transistors.

In other words, the objects of the invention are achieved in that the common node for the source electrode of the first field effect transistor and for the first capacitor is connected to reference-ground potential via a series circuit comprising the path of a second field effect transistor and that of a third field effect transistor, in that the common node for the drain electrode of the first field effect transistor, for the second capacitor and for the voltage source is connected to reference-ground potential via a series circuit comprising the path of a fourth field effect transistor and that of a fifth field effect transistor. Furthermore, the gate electrodes of the first, fourth and fifth field effect transistors and the common node for the second and third field effect transistors are connected to one another, the common node for the fourth and fifth field effect transistors is connected to the gate electrode of the second field effect transistor and connected to reference-ground potential via the path of a sixth field effect transistor. Finally, the control output of the control unit is connected to the gate electrode of the third field effect transistor and to the input of an inverter whose output is connected to the gate electrode of the sixth field effect transistor.

The first capacitor is discharged from the high voltage to the low voltage quickly, precisely and virtually linearly.

Other features which are considered as characteristic for the invention are set forth in the appended claims.

Although the invention is illustrated and described herein as embodied in a circuit configuration for discharging a capacitor which has been charged to a high voltage to a low voltage under the control of a control unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
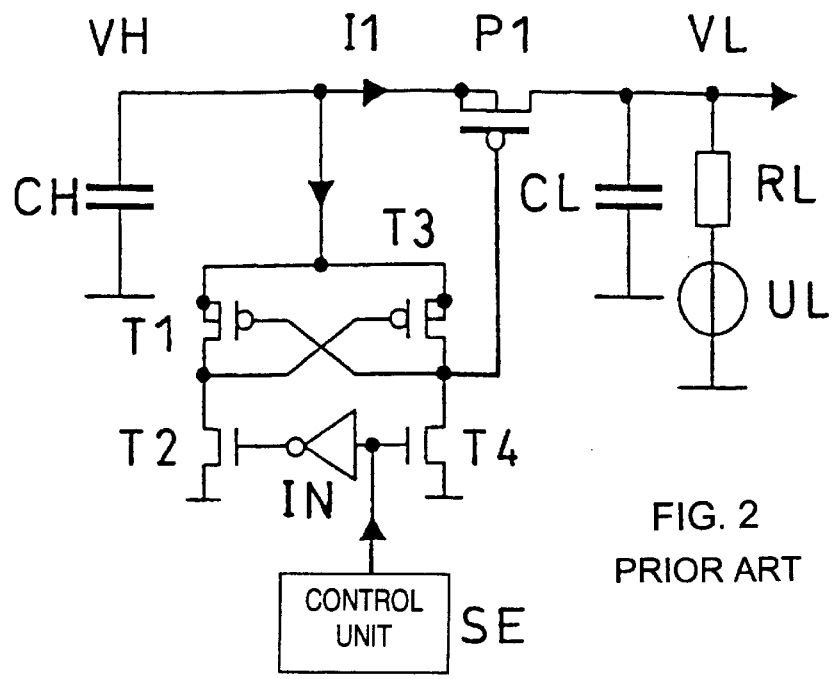
FIG. 2 is a circuit schematic of a circuit configuration based on the prior art.

Referring now to the figures of the drawing in detail and first, particularly, to FIG. 1 thereof, the exemplary embodiment of the invention is configured as follows:

One electrode of a capacitor CH is connected to reference-ground potential while the other electrode thereof is connected to the source electrode of a field effect transistor P2 and to that of a field effect transistor P1 whose drain electrode is connected to reference-ground potential via a capacitor CL. Arranged in parallel with the capacitor CL is a voltage source UL with its internal resistance RL. The drain electrode of the field effect transistor P2 is connected to reference-ground potential via a series circuit comprising the path of a field effect transistor M1 and that of a protective resistor R. The common node for the field effect transistor P1 and for the capacitor CL is connected to reference-ground potential via a series circuit comprising the path of a field effect transistor P3 and that of a field effect transistor M2. The interconnected gate electrodes of the field effect transistors P1, P3 and M2 are connected to the common node for the two field effect transistors P2 and M1. The common node for the field effect transistors P3 and M2 is connected to the gate electrode of the field effect transistor P2 and is connected to reference-ground potential via the path of a further field effect transistor M3. The control output of the control unit SE is connected to the gate electrode of the field effect transistor M1 and to the input of an inverter IN whose output is connected to the gate electrode of the field effect transistor M3.

In addition to the first inverter IN, the field effect transistors P3 and M2 form a second inverter.

Figure 1:
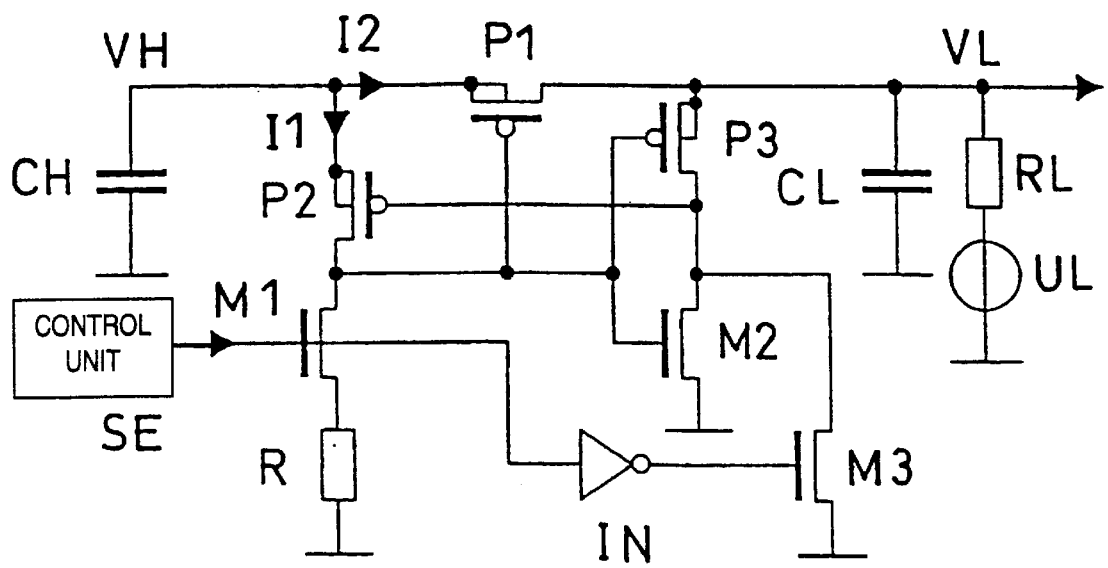
FIG. 1 is a circuit schematic of an exemplary embodiment of the invention.

The discharging operation of the inventive exemplary embodiment shown in FIG. 1 is explained below.

Before the start of the discharging operation, the capacitor CH has been charged to the relatively high voltage VH. The control output of the control unit SE outputs a logic zero to the gate electrode of the field effect transistor M1 and to the input of the inverter IN. The logic 1 at the output of the inverter IN turns on the field effect transistor M3, which means that reference-ground potential is applied to the gate electrode of the field effect transistor P2. On account of the fact that the field effect transistor P2 therefore draws the gate electrode of the field effect transistor P1 to the potential VH, the field effect transistor P1 is off. The capacitor CL has been charged to the low voltage VL. The second inverter, formed from the field effect transistors P3 and M2, delivers a logic zero at its output, because the field effect transistor M2 conducts heavily while the field effect transistor P3 is off. The protective resistor R limits the current through the path of the field effect transistor M1 and therefore protects it against damage or even destruction by excessive currents.

To discharge the capacitor CH from the high voltage VH to the low voltage VL, the output of the control unit SE outputs a logic 1 to the gate electrode of the field effect transistor M1 and to the input of the inverter IN. Owing to the fact that the two field effect transistors P2 and M1 are therefore on, a discharge current I1 flows from the capacitor CH via the paths of the two field effect transistors P2 and M1 and via the protective resistor R to reference-ground potential, as a result of which the gate electrode of the field effect transistor P1 is drawn to reference-ground potential. During this phase, the majority of the charge stored on the capacitor CH is discharged via reference-ground potential. As soon as the voltage VH on the capacitor CH has fallen to the value VL, and hence the potential on the gate electrode of the field effect transistor P1 has also fallen, this field effect transistor P3 slowly starts to turn on, while the field effect transistor M2 slowly turns off. The potential at the output of the inverter formed from the field effect transistors P3 and M2 therefore becomes positive, which means that the field effect transistor P2 slowly changes to the off state. When the field effect transistor P2 is off, the gate electrode of the field effect transistor P1 is quickly discharged to reference-ground potential, because the resistance of the field effect transistor M1 is now lower than that of the field effect transistor P2. The field effect transistors P2, P3 and M2 therefore abruptly connect the gate electrode of the field effect transistor P1 to reference-ground potential, as a result of which the discharging operation via the paths of the field effect transistors P2 and M1 and of the protective resistor R is stopped. At the same time, the field effect transistor P1 turns on and connects the capacitors CH and CL in parallel, so that the two capacitors have now been charged to the low voltage VL. To hold the capacitor CH at this potential, the comparatively small current I2 flows between the two capacitors CH and CL. As soon as the potential across the capacitor CH has fallen to the low value VL required, the discharging path is interrupted and at the same time a holding path via the path of the field effect transistor P1 is activated.

Figure 3:
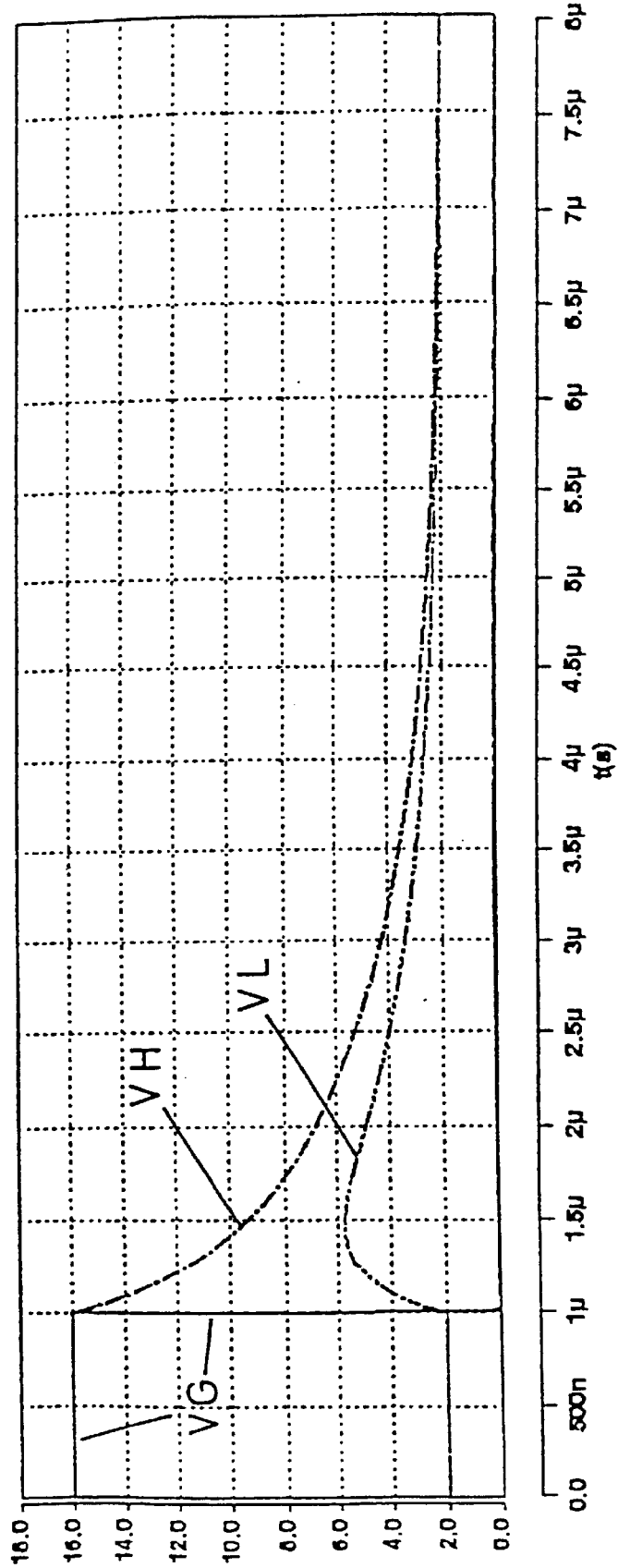
FIG. 3 is a discharge graph relating to the prior art circuit configuration from FIG. 2.
Figure 4:
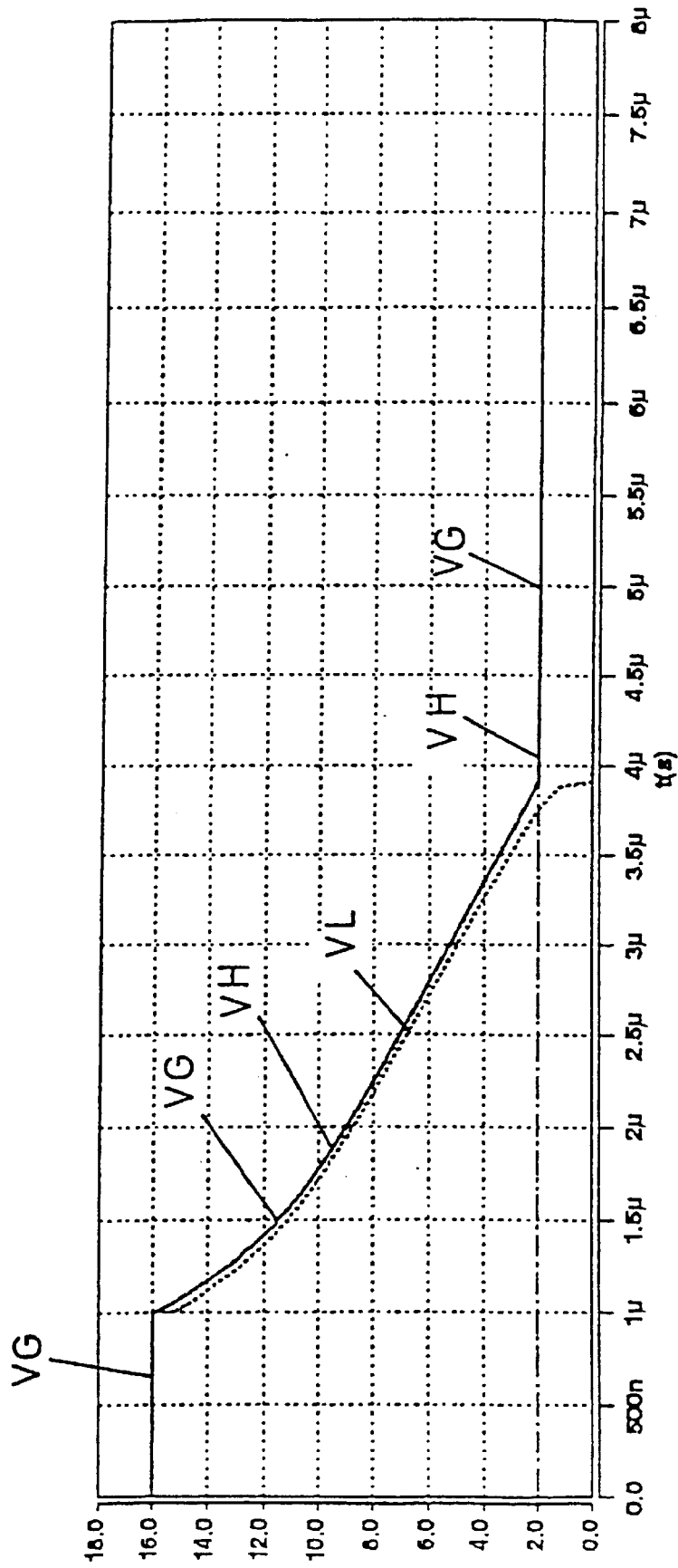
FIG. 4 is a discharge graph relating to the invention.

FIGS. 3 and 4 show the time profile for the potential VG on the gate electrode of the PMOS field effect transistor P1, for the potential VH across the capacitor CH and for the potential VL across the capacitor CL.

FIG. 4 shows the discharging graph for the known circuit configuration depicted in FIG. 2. The discharging operation takes place in accordance with an e function. The voltage rise occurring across the capacitor CL at the start of the discharging operation can be seen clearly.

By contrast, the discharging graph for the invention shown in FIG. 3 exhibits a virtually linear profile without any voltage rise.

The fundamental advantages of the invention can be seen in that a rapid and virtually linear discharging operation is achieved and in that no more excessive voltages arise. This significantly increases the reliability and useful life of components connected downstream, particularly of CMOS transistors.

The protective resistor R is not absolutely essential but increases the reliability and useful life of the field effect transistors P2 and M1.

Preferably, PMOS field effect transistors are provided for the field effect transistors P1, P2 and P3, whereas CMOS field effect transistors are preferable for the rest of the field effect transistors M1, M2 and M3.

The invention is suitable generally for rapidly and reliably discharging a capacitor from a high voltage to a low voltage. The discharging operation takes place virtually linearly; overvoltages do not arise at any time during the discharging operation. The invention is therefore particularly suitable for semiconductor circuits which require both high voltages, for example on account of memories of a particular design, and low voltages for saving energy.

We claim:

1. A circuit configuration, comprising:
   a first capacitor having a first electrode connected to reference-ground potential and a second electrode;
   a second capacitor having a first electrode connected to reference-ground potential and a second electrode;
   a first field effect transistor having a source electrode and a drain electrode connected between said second electrode of said first capacitor and said second electrode of said second capacitor;
   a voltage source having an internal resistance connected in parallel with said second capacitor;
   a second field effect transistor and a third field effect transistor connected to form a series circuit;
   a first common node between said source electrode of said first field effect transistor and said first capacitor connected to reference-ground potential via said series circuit formed of said second field effect transistor and said third field effect transistor;
   a fourth field effect transistor and a fifth field effect transistor connected to form a series circuit;
   a second common node between said drain electrode of said first field effect transistor, said second capacitor, and said voltage source connected to reference-ground potential via said series circuit formed of said fourth field effect transistor and said fifth field effect transistor;
   said first, fourth and fifth field effect transistors each having a gate electrode connected to a common node between said second and third field effect transistors;
   a sixth field effect transistor having a gate electrode and having a path connected between reference-ground potential and a common node between said fourth and fifth field effect transistors, and said second field effect transistor having a gate electrode connected to said common node between said fourth and fifth field effect transistors;
   an inverter having an input and having an output connected to said gate electrode of said sixth field effect transistor; and
   a control unit having a control output connected to a gate electrode of said third field effect transistor and to said input of said inverter.

2. The circuit configuration according to claim 1, which further comprises a protective resistor connected between said third field effect transistor and reference-ground potential.

3. The circuit configuration according to claim 1, wherein said first, second and fourth field effect transistors are PMOS field effect transistors.

4. The circuit configuration according to claim 1, wherein said third, fifth and sixth field effect transistors are CMOS field effect transistors.

* * * * *